(12) United States Patent
Mann et al.

(10) Patent No.: US 9,298,238 B2
(45) Date of Patent: Mar. 29, 2016

(54) CMOS POWER BACKUP SWITCHING CIRCUIT AND METHOD FOR OPERATING A CMOS POWER BACKUP SWITCHING CIRCUIT

(75) Inventors: Allen Mann, Menlo Park, CA (US); Kevin Mahooti, Sunnyvale, CA (US)

(73) Assignee: NXP B.V., Eindhoven (NL)

(*) Notice: Subject to any disclaimer, the term of this patent is extended or adjusted under 35 U.S.C. 154(b) by 764 days.

(21) Appl. No.: 13/536,573

(22) Filed: Jun. 28, 2012

(65) Prior Publication Data

US 2014/0001861 A1 Jan. 2, 2014

(51) Int. Cl.
*H02J 7/00* (2006.01)
*H02J 9/00* (2006.01)
*G06F 1/30* (2006.01)
*H03K 17/62* (2006.01)
*H02J 1/00* (2006.01)
*G06F 11/00* (2006.01)

(52) U.S. Cl.
CPC ............ *G06F 1/30* (2013.01); *H03K 17/62* (2013.01); *G06F 11/00* (2013.01); *H02J 1/00* (2013.01); *Y10T 307/615* (2015.04); *Y10T 307/625* (2015.04)

(58) Field of Classification Search
CPC ............ H02J 9/062; H02J 9/061; H02J 9/06; H02J 7/34; H02J 1/00; G06F 1/30; G06F 1/00; G06F 1/32; G06F 11/00; H03K 17/62; H03K 17/687
USPC .......... 307/66, 11, 35, 39, 151; 327/408, 427, 327/64, 345, 70; 713/340, 300; 714/24
See application file for complete search history.

(56) References Cited

U.S. PATENT DOCUMENTS

| | | | |
|---|---|---|---|
| 4,617,473 A | 10/1986 | Bingham | |
| 4,908,790 A | 3/1990 | Little et al. | |
| 5,783,964 A * | 7/1998 | Eitan | G11C 5/141 327/143 |
| 5,886,561 A * | 3/1999 | Eitan | H02J 9/061 307/64 |
| 6,653,878 B2 * | 11/2003 | Nolan | H03K 19/0013 327/108 |
| 7,370,214 B2 | 5/2008 | Sheng et al. | |
| 7,394,172 B2 | 7/2008 | Anderson et al. | |
| 7,962,787 B2 * | 6/2011 | Camilleri | G06F 11/1441 323/282 |
| 8,225,125 B2 * | 7/2012 | Yu | H03K 17/693 713/300 |
| 2002/0070611 A1 * | 6/2002 | Cline | A61H 33/005 307/149 |
| 2008/0111611 A1 * | 5/2008 | Thiele | H03K 17/04123 327/427 |

* cited by examiner

*Primary Examiner* — Rexford Barnie
*Assistant Examiner* — Jagdeep Dhillon (57) ABSTRACT

A Complementary Metal Oxide Semiconductor (CMOS) power switching circuit and a method for operating a CMOS power switching circuit are described. In one embodiment, a CMOS power switching circuit includes a voltage selection circuit configured to output the highest output voltage between an output voltage of a primary power supply and an output voltage of a backup power supply and a control circuit configured to connect a load circuit to either the primary power supply or the backup power supply by comparing the output voltage of the primary power supply with a power supply switchover level that is set as a function of the highest output voltage. The backup power supply serves as a voltage reference to set the power supply switchover level only when the output voltage of the primary power supply is lower than the output voltage of the backup power supply. Other embodiments are also described.

19 Claims, 4 Drawing Sheets

CMOS POWER BACKUP SWITCHING CIRCUIT AND METHOD FOR OPERATING A CMOS POWER BACKUP SWITCHING CIRCUIT

Embodiments of the invention relate generally to electronic circuits and methods for operating electronic circuits and, more particularly, to Complementary Metal Oxide Semiconductor (CMOS) power switching circuits and methods for operating CMOS power switching circuits.

An electronic circuit relies on a power supply to provide power for operating a load circuit. If the power supply does not provide adequate power, the load circuit may malfunction. Typical reasons that a power supply provides inadequate power to the load circuit include an intentional or an inadvertent turn-off of the power supply, an open conductor or a short-circuit that causes the voltage of the power supply output to drop to zero volts, a component failure that causes the voltage of the power supply to drop below the minimum voltage level required by the load circuit, and power discharge of the power supply.

If a power supply does not provide adequate power to a load circuit, operation of the load circuit can be interrupted until adequate power is restored. However, some load circuits require uninterrupted power. To accommodate a load circuit that requires uninterrupted power, a primary power supply as well as an auxiliary power supply may be provided as a backup. A power switching circuit is often used to switch the load circuit to the auxiliary power supply in the event of a failure of the primary power supply.

A CMOS power switching circuit and a method for operating a CMOS power switching circuit are described. In one embodiment, a CMOS power switching circuit includes a voltage selection circuit configured to output the highest output voltage between an output voltage of a primary power supply and an output voltage of a backup power supply and a control circuit configured to connect a load circuit to either the primary power supply or the backup power supply by comparing the output voltage of the primary power supply with a power supply switchover level that is set as a function of the highest output voltage. The backup power supply serves as a voltage reference to set the power supply switchover level only when the output voltage of the primary power supply is lower than the output voltage of the backup power supply. Other embodiments are also described.

In one embodiment, a CMOS power switching circuit includes a voltage selection circuit configured to output the highest output voltage between an output voltage of a primary power supply and an output voltage of a battery backup power supply, a voltage divider configured to scale the output voltage of the primary power supply to generate a scaled output voltage, a voltage sensor circuit configured to set a threshold voltage as a function of the highest output voltage, to compare the scaled output voltage with the threshold voltage, and to output a digital signal indicative of the magnitude of the scaled output voltage relative to the threshold voltage, a power transfer switch configured to connect a load circuit to either the primary power supply or the battery backup power supply, and a switch control circuit configured to control the switching of the power transfer switch between the primary power supply and the battery backup power supply based on the digital signal. The voltage sensor circuit is further configured to set the threshold voltage as the function of the output voltage of the backup power supply only when the output voltage of the primary power supply is lower than the output voltage of the backup power supply.

In an embodiment, a method for operating a CMOS power switching circuit includes outputting the highest output voltage between an output voltage of a primary power supply and an output voltage of a backup power supply and connecting a load circuit to either the primary power supply or the backup power supply by comparing the output voltage of the primary power supply with a power supply switchover level that is set as a function of the highest output voltage. The backup power supply serves as a voltage reference to set the power supply switchover level only when the output voltage of the primary power supply is lower than the output voltage of the backup power supply.

Other aspects and advantages of embodiments of the present invention will become apparent from the following detailed description, taken in conjunction with the accompanying drawings, depicted by way of example of the principles of the invention.

Throughout the description, similar reference numbers may be used to identify similar elements.

It will be readily understood that the components of the embodiments as generally described herein and illustrated in the appended figures could be arranged and designed in a wide variety of different configurations. Thus, the following detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment. Rather, language referring to the features and advantages is understood to mean that a specific feature, advantage, or characteristic described in connection with an embodiment is included in at least one embodiment. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment. Thus, the phrases "in one embodiment," "in an embodiment," and similar language throughout this specification may, but do not necessarily, all refer to the same embodiment.

Figure 1:
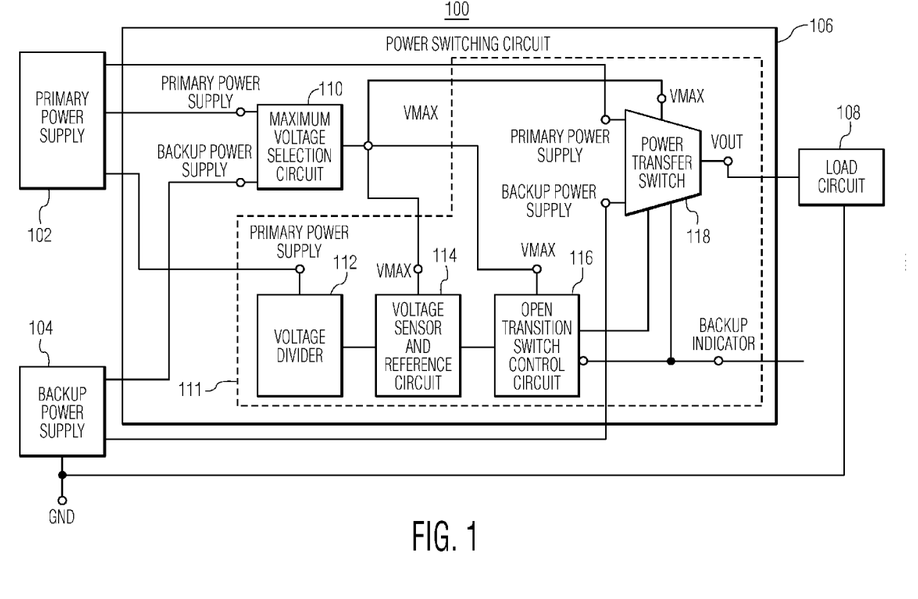
FIG. 1 is a schematic block diagram of an electronic circuit in accordance with an embodiment of the invention

FIG. 1 is a schematic block diagram of an electronic circuit 100 in accordance with an embodiment of the invention. The electronic circuit may be used for various devices and applications, such as computers, industrial machineries, and appliances. For example, the electronic circuit may be a microcontroller or a part of a microcontroller. Examples of microcontrollers include, without limitation, 8-bit microcontrollers, 16-bit microcontrollers, and 32-bit microcontrollers. In an embodiment, the electronic circuit is an Advanced RISC Machines (ARM) microcontroller or a part of an ARM microcontroller. In the embodiment depicted in FIG. 1, the electronic circuit includes a primary power supply 102, a backup power supply 104, a power switching circuit 106, and a load circuit 108. In an embodiment, the electronic circuit is a single device/circuit that is implemented on a single substrate. In another embodiment, the electronic device includes a network of devices that are implemented in separate substrates. Although the electronic circuit is depicted and described with certain components and functionality, other embodiments of the electronic circuit may include fewer or more components to implement less or more functionality. For example, the electronic circuit may include more than two power supplies, multiple power switching circuits, and/or multiple load circuits.

The primary and backup power supplies 102, 104 of the electronic circuit 100 supply power to the load circuit 108. In the embodiment depicted in FIG. 1, the primary power supply 102 is the primarily power source for the load circuit 108 and the backup power supply supplies power to the load circuit if the primary power supply satisfies a certain condition. In an embodiment, the backup power supply supplies power to the load circuit if the output voltage of the primary power supply is below a voltage threshold, which is also referred to as the power supply switchover point. In another embodiment, the backup power supply supplies power to the load circuit if the primary power supply is turned off. The backup power supply may be turned on and supply power to the load circuit if the primary power supply satisfies the certain condition. In an embodiment, the backup power supply is by default turned off and does not supply power to the load circuit and is turned on only if the primary power supply satisfies the certain condition. A single backup power supply needs to be strong enough so that its output voltage is not pulled down by the load circuit, otherwise a second independent backup power supply may be needed. In an embodiment, the backup power supply includes two independent power supplies, one supplying power to the power switching circuit 106 and the other supplying power to the load circuit. The flexibility of handling a single backup power supply or two independent backup power supplies makes the power switching circuit 106 more robust.

The primary power supply 102 may include any type of power supply. In an embodiment, the primary power supply is a plugged-in power supply or other type of power supply that can supply an effectively endless amount of power. The backup power supply 104 may include any type of power supply. In an embodiment, the backup power supply is a battery power supply or other type of power supply that can supply a limited amount of power. The backup power supply may be a battery having a limited useful life time. For example, the backup power supply may be a lithium battery or any other type of battery. In an embodiment, instead of including a power supply 102 or 104, the electronic circuit 100 includes an interface to the power supply 102 or 104.

The load circuit 108 of the electronic circuit 100 can be any type of electrical load. For example, the load circuit may include a capacitive load, a resistive load, and/or an inductive load. In an embodiment, the load circuit requires uninterrupted power. For example, the load circuit may be a real-time clock circuit that performs essential time keeping functions or a volatile memory circuit that contains unique or critical data. In the embodiment depicted in FIG. 1, the load circuit and the backup power supply 104 are connected to the ground (GND). Although the load circuit and the backup power supply are connected to the same voltage terminal (i.e., the ground) in the embodiment depicted in FIG. 1, in some other embodiments, the load circuit and the backup power supply are not connected to the same voltage terminal. For example, in some embodiment, at least one of the load circuit and the backup power supply is not connected to the same ground.

The power switching circuit 106 of the electronic circuit 100 is configured to switch the power source for the load circuit 108 between the primary power supply 102 and the backup power supply 104. In the embodiment depicted in FIG. 1, the power switching circuit 106 is a CMOS power switching circuit that is interposed between the load circuit and the power supplies 102, 104. However, the power switching circuit 106 is not limited to CMOS technology. The power switching circuit 106 may be configured to cause the essential functions or all of the functions of the load circuit to be powered by the backup power supply if the primary power supply satisfies a certain condition. In an embodiment, the power switching circuit 106 switches the load circuit to the backup power supply if the output voltage of the primary power supply or a scaled version of the output voltage of the primary power supply is below a voltage threshold, which is also referred to as the power supply switchover point. For example, the power switching circuit 106 continually compares the voltage levels of the primary and backup power supplies and switches the load circuit to the backup power supply when the voltage of the primary power supply or a scaled version of the output voltage of the primary power supply falls below the power supply switchover point, which may be below the power supply voltage level of the backup power supply. After the power switching circuit 106 switches the load circuit to the backup power supply, the power switching circuit 106 switches the load circuit back to the primary power supply if the voltage level of the primary power supply or a scaled version of the output voltage of the primary power supply rises above the power supply switchover point. In another embodiment, the power switching circuit 106 switches the load circuit to the backup power supply if the primary power supply is turned off.

In the embodiment depicted in FIG. 1, the power switching circuit 106 includes a maximum voltage selection circuit 110 and a control circuit 111, which includes a voltage divider 112, a voltage sensor and reference circuit or voltage sensor circuit 114, an open transition switch control circuit 116, and a power transfer switch 118. Although the power switching circuit 106 is depicted and described with certain components and functionality, other embodiments of the power switching circuit 106 may include fewer or more components to implement less or more functionality. For example, the power switching circuit 106 may include multiple maximum voltage selection circuits, voltage dividers, voltage sensor circuits, open transition switch control circuits, and/or power transfer switches. In addition, although the power switching circuit 106 is shown in FIG. 1 as being connected to one primary power supply 102 and one backup power supply 104, in some other embodiments, the power switching circuit 106 may be connected to multiple primary power supplies and/or multiple backup power supplies.

The maximum voltage selection circuit 110 of the power switching circuit 106 is configured to output the highest output voltage, which is labeled as "VMAX," between the primary power supply 102 and the backup power supply 104. In an embodiment, the maximum voltage selection circuit 110 is configured to compare output voltages of the primary power supply and the backup power supply and automatically output the highest output voltage of the primary power supply and the backup power supply. The source of VMAX is the primary power supply if the output voltage level of the primary power supply is higher than (or above) the output voltage level of the backup power supply and the source of VMAX is the backup power supply if the output voltage level of the primary power supply is lower than (or below) the output voltage level of the backup power supply. The source of VMAX can be the primary power supply or the backup power supply if output voltage levels of the primary power supply and the backup power supply are identical to each other. The maximum voltage selection circuit 110 provides the highest voltage level between the primary power supply and the backup power supply to P-type MOS (PMOS) transistors (PMOSTs) (e.g., PMOS transistors of the power transfer switch 118) to minimize leakage currents flowing through the conduction canals of PMOS transistors when the PMOS transistors are turned off and flowing into the floating N-well substrates of the PMOS transistors.

The control circuit 111 of the power switching circuit 106 is configured to connect the load circuit 108 to either the primary power supply 102 or the backup power supply 104 by comparing the output voltage of the primary power supply with a power supply switchover level. In the embodiment depicted in FIG. 1, the power supply switchover level is set as a function of the voltage level of the highest output voltage VMAX between the primary power supply and the backup power supply. Allowing for process, voltage, and temperature (PVT) variations, the power supply switchover level may be set to be within a given range of the output voltage of the primary power supply. In an embodiment, the power supply switchover level is set to be within a 2.0V to 2.5V output voltage range of the primary power supply output, such as 2.2V, when the output voltage of the backup power supply is 3.0V. In this embodiment, the current drain on the backup power supply is very low (typically on the order of nanoamperes (nA) until the output voltage of the primary power supply approaches the power supply switchover level and the output of the voltage sensor circuit 114 changes state, which causes momentary current spikes. In the embodiment depicted in FIG. 1, the backup power supply serves as a voltage reference to set the power supply switchover level only when the output voltage of the primary power supply is lower than the output voltage of the backup power supply. Because the backup power supply serves as a voltage reference to set the power supply switchover level only when the output voltage of the primary power supply is lower than the output voltage of the backup power supply, power is not discharged from the backup power supply by the power switching circuit 106 until the output voltage of the primary power supply output sinks below the output voltage of the backup power supply. As a result, the lifetime of the backup power supply, which is usually a battery, is extended.

In the embodiment depicted in FIG. 1, the voltage divider 112 is configured to convert the output voltage of the primary power supply 102 to an input voltage, which is input into the voltage sensor circuit 114. In the embodiment depicted in FIG. 1, the voltage divider 112 is configured to scale or reduce the voltage level of the primary power supply down to a level suitable for comparison with a voltage threshold of the voltage sensor circuit 114. The voltage sensor circuit 114 is configured to detect whether or not the scaled down output voltage of the primary power supply from the voltage divider 112 is above or below a voltage threshold, which is also referred to as the power supply switchover point, and to trigger the appropriate power supply switchover based on the detection result. In the embodiment depicted in FIG. 1, the voltage sensor circuit 114 is further configured to output a digital signal that indicates the magnitude of the scaled down output voltage of the primary power supply from the voltage divider 112 relative to (e.g., higher than (or above), equal to, or lower than (or below)) the power supply switchover point at which the power supply of the load circuit 108 is switched over from the primary power supply to the backup power supply 104. In the embodiment depicted in FIG. 1, the power supply switchover point is below (i.e., lower/smaller than) the power supply voltage of the backup power supply. In an embodiment, the voltage sensor circuit 114 outputs a digital signal that triggers the switch of the power supply of the load circuit from the primary power supply to the backup power supply if the scaled down output voltage of the primary power supply is detected as being below the power supply switchover point. In an embodiment, after the power supply of the load circuit is switched to the backup power supply, the voltage sensor circuit 114 outputs a digital signal that triggers the switch of the power supply of the load circuit back to the primary power supply if the scaled down output voltage of the primary power supply is detected as being above the power supply switchover point.

The open transition switch control circuit 116 of the power switching circuit 106 is configured to control the switching of the power transfer switch 118 between the primary power supply 102 and the backup power supply 104. In the embodiment depicted in FIG. 1, power is supplied to the open transition switch control circuit 116 by the highest output voltage VMAX between the primary power supply and the backup power supply. Because the backup power supply supplies power to the open transition switch control circuit 116 only when the output voltage of the primary power supply is lower than the output voltage of the backup power supply, power is not discharged from the backup power supply by the open transition switch control circuit 116 until the output voltage of the primary power supply output sinks below the output voltage of the backup power supply. The open transition switch control circuit 116 is configured to control the switching of the power transfer switch 118 between the primary power supply and the backup power supply based on the digital signal from the voltage sensor circuit 114. Specifically, the open transition switch control circuit 116 prevents circuit shorting between the primary power supply and the backup power supply during the switching operation, as described below. The open transition switch control circuit 116 is also referred to as a "break-before-make circuit." In an exemplary operation, the open transition switch control circuit 116 first breaks the connection of the load circuit 108 to its current power supply before connecting the load circuit to the newly selected power supply. The open transition switch control circuit 116 also provides a status signal to indicate which of the two power supplies 102, 104 is applied to the load. The status signal may also be used for control of all of the components or some components of the load circuit or to record the occurrence of a power outage. For example, the status signal can be used to disable non-essential portions of the load circuitry. In the embodiment depicted in FIG. 1, the status signal from the open transition switch control circuit 116, labeled as "backup indicator," is used to indicate whether or not the backup power supply is connected to the load circuit and supplies power to the load circuit and is one of the two inverse complementary control signals transmitted to the power transfer circuit 118. The status indicator signal may also be outputted to external circuits to control the external circuits or record the occurrence of a switchover or a power-outage event.

The power transfer switch 118 of the power switching circuit 106 is configured to connect the load circuit 108 to either the primary power supply or the backup power supply based on control signals from the open transition switch control circuit 116. In the embodiment depicted in FIG. 1, power is supplied to the power transfer switch 118 by the highest output voltage VMAX between the primary power supply 102 and the backup power supply 104. The selected power supply output, marked as "VOUT," comes out of an output terminal of the power transfer switch 118 and goes to the load circuit 108. The selected power supply output of the power transfer switch 118 is either the output voltage from the primary power supply or the output voltage from the backup power supply. In an embodiment, the power transfer switch 118 includes transistor devices that connect or disconnect the load circuit to either the primary power supply or the backup power supply. Typically, transistor devices in the power transfer switch 118 are PMOS transistors because the PMOS transistors exhibit minimal impedance between the selected power supply and the load circuit. To minimize the leakage currents, both the bias voltage for the floating N-well substrates of the PMOST devices and the voltage applied to gates of the transistor devices is set to VMAX.

One of the simplest and most commonly used power switching circuits is a diode network. Because a diode has only non-active components, the diode consumes the least amount of standby power. However, there are some disadvantages associated with power switching diodes. For example, the voltage provided to a load circuit is reduced by a diode threshold voltage drop (typically 0.7V for a silicon diode) before current flows in the forward biased direction. In another example, a low-power backup battery can be unnecessarily drained when the output voltage level of the primary power supply is slightly below the backup battery output voltage, causing the useful life of the backup battery to be reduced or even totally depleted by the time the battery is needed. Some conventional power switching circuits employ active components (i.e., an analog comparator which typically includes a differential input stage, an output stage, and voltage or current reference bias circuits) that can consume a significant amount of power during operation. In addition, in conventional power switching circuits with active components, the standby power consumption is high and a backup power supply (e.g., an auxiliary battery supply) can be more rapidly drained, causing the useful life of the backup power supply to be shortened. In addition, in conventional power switching circuits with active components, the backup power supply often tends to reduce the voltage provided to the load circuit, which may further degrade operation of the essential features of the load circuit. Furthermore, in conventional power switching circuits with active components, the switchover threshold point between the power supplies is fixed and generally occurs at the auxiliary battery voltage output level, which may be far above the minimum voltage level required by the load circuit and may unnecessarily shorten the useful life of the backup battery. Additionally, in conventional power switching circuits with active components, backup switch circuits are always in operation even when the load circuit is in powered-down mode. Therefore, backup switch circuits can cause a significant additional background current drain on either the primary power supply or the backup power supply, depending on which power supply is being used to power the backup switch circuits.

The power switching circuit 106 avoids the disadvantages associated with conventional power switching circuits and uses a limited number of transistor devices to achieve a low power consumption. The power switching circuit 106 achieves these benefits using low-power CMOS analog and digital design techniques, a limited number of devices, and the backup power supply 104 (typically a battery) as the voltage reference to set the power supply switchover level only when the output voltage of the primary power supply 102 sinks below the output voltage of the backup power supply. In this fashion, the backup power supply is connected to the voltage sensor circuit 114 only when the output voltage of the primary power supply sinks below the output voltage of the backup power supply. Because the backup power supply serves as a voltage reference to set the power supply switchover level only when the output voltage of the primary power supply is lower than the output voltage of the backup power supply, power is not discharged from the backup power supply by the power switching circuit until the output voltage of the primary power supply output sinks below the output voltage of the backup power supply. In addition, because the backup power supply supplies power to the open transition switch control circuit 116 only when the output voltage of the primary power supply is lower than the output voltage of the backup power supply, power is not discharged from the backup power supply by the open transition switch control circuit 116 until the output voltage of the primary power supply output sinks below the output voltage of the backup power supply. As a result, the lifetime of the backup power supply, which is usually a battery, is extended. More specifically, the power switching circuit 106 can achieve a low standby current (typically 15 nA), can make the switchover voltage level selectable for efficient use of the backup power supply, can allow the primary power supply to provide the power to the load circuit at output voltage levels considerably below that of the backup power supply, and can minimize the voltage drop between the power supplies and the load circuit 108.

Figure 2:
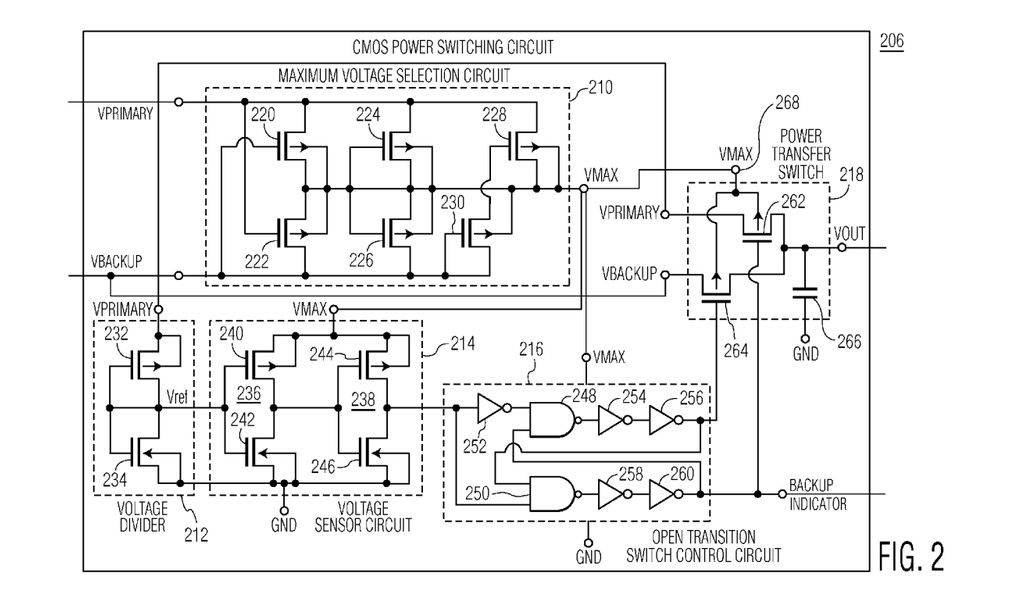
FIG. 2 depicts an embodiment of the CMOS power switching circuit depicted in FIG. 1.

FIG. 2 depicts an embodiment of the CMOS power switching circuit 106 depicted in FIG. 1. In the embodiment depicted in FIG. 2, a CMOS power switching circuit 206 includes a maximum-voltage select circuit 210, a voltage divider 212, a voltage sensor and reference circuit or voltage sensor circuit 214, an open transition switch control circuit 216, and a power transfer switch 218.

In the embodiment depicted in FIG. 2, the backup power supply 104 is a battery, which will be referred to as the "battery backup supply." Voltages of the primary power supply 102 and the battery backup supply, marked as "VPRIMARY" and "VBACKUP," respectively, are applied between terminals of the maximum voltage selection circuit 210, the power transfer switch 218, the voltage divider 212, and the ground. Specifically, the power transfer switch 218 is connected to the primary power supply, to the battery backup supply, and to ground (GND). The selected power supply output, marked as "VOUT," comes out of an output terminal of the power transfer switch 218 and goes to the load circuit 108 (shown in FIG. 1). One of the input control signals of the power transfer switch 218 from the open transition switch control circuit 216 is also a status indicator signal, labeled as "backup indicator." The status indicator signal may also be outputted to external circuits to control the external circuits or record the occurrence of a switchover or a power-outage event.

The maximum voltage selection circuit 210 performs functions similar to or the same as the maximum voltage selection circuit 110 of FIG. 1. Specifically, the maximum voltage selection circuit 210 includes six PMOST devices 220, 222, 224, 226, 228, 230 with their floating N-wells substrates connected to an output terminal, from which the highest output voltage between the primary power supply 102 and the backup power supply 104, labeled as "VMAX," is output. N-wells are the n-type diffusions in a p-type wafer that form the substrate for the PMOST devices and must be tied to the power supply for biasing. In the embodiment depicted in FIG. 2, the N-well substrate connections of the PMOST devices 220, 222, 224, 226, 228, 230 are indicated by outward arrows. The PMOST devices 220, 222 are cross-coupled PMOST devices with their source terminals connected to one of the power supplies 102, 104, their drain terminals connected to the output terminal from which the voltage VMAX is outputted, and their gate terminals connected to the opposite power supply 102 or 104. When the voltage difference between the primary power supply and the battery backup supply exceeds the PMOST threshold voltage ($V_{THP}$,) the power supply with the highest voltage is shorted to the output terminal from which the voltage VMAX is outputted. The PMOST devices 224, 226 are diode-connected PMOST devices whose gate terminal is connected to its drain terminal. A diode-connected PMOST device behaves like a diode with respect to the source and drain terminals. The source/drain terminals of a diode-connected PMOST device are equivalent to the anode/cathode terminals of a diode with respect to terminal voltage-biasing (forward/reverse) and current conduction. The source terminals of the PMOST devices 224, 226 are connected to the respective power supply 102 or 104, the drain terminals of the PMOST devices 224, 226 are connected to the output terminal VMAX, and the gate terminals of the PMOST devices 224, 226 also are connected to the output terminal from which the voltage VMAX is outputted. Whenever the voltage difference between a power supply 102 or 104 and VMAX is greater than $V_{THP}$, the corresponding PMOST device 224 or 226 will behave like a diode and source current to the output terminal from which the voltage VMAX is outputted. The PMOST device 228 is configured such that the source terminal of the PMOST device 228 is connected to the primary power supply, the drain terminal of the PMOST device 228 is connected to the output terminal from which the voltage VMAX is outputted, and the gate terminal of the PMOST device 228 is connected to the battery backup supply through the diode-configured PMOST device 230. The diode-configured PMOST device 230 is configured such that its gate and source terminals are connected to the battery backup supply and its drain terminal connected to the gate of the other PMOST device 228. The configuration of the PMOST devices 228, 230 can reduce the gate voltage by $V_{THP}$ such that a corresponding PMOST device connects the primary power supply to the output terminal when the output voltage levels of the primary power supply and the battery backup supply are close to each other. In an embodiment, device sizes of the PMOST devices 220, 222, 224, 226, 228, 230 are optimized for smooth switching between the primary and backup power supplies and for minimizing the voltage drop of VMAX when the output voltage levels of the primary and backup power supplies are close to each other. An example operation of the maximum voltage selection circuit 210 is described below. At the beginning of the example operation, the output voltage VPRIMARY of the primary power supply is far above the output voltage VBACKUP of the battery backup supply (i.e., VPRIMARY>>VBACKUP+$V_{THP}$). Because of the voltage difference between the primary power supply and the battery backup supply, the PMOST device 220 is fully turned on and the gate of the PMOST device 228 charges up to approximately VBACKUP–$V_{THP}$, which causes the PMOST device 228 to turn on. The PMOST devices 222, 224, 226 are still turned off. As the output voltage VPRIMARY of the primary power supply decreases to the vicinity of the output voltage VBACKUP of the battery backup supply, the PMOST devices 220, 228 are turned off. When the output voltage VPRIMARY of the primary power supply is equal to the output voltage VBACKUP of the battery backup supply, the output voltage VMAX of the maximum voltage selection circuit 210 drops slightly to a point where the diode-configured PMOST devices 224, 226 will be turned on. As the output voltage VPRIMARY of the primary power supply moves below the output voltage VBACKUP of the battery backup supply (e.g., VBACKUP>>VPRIMARY+$V_{THP}$), the PMOST device 222 is fully turned on, the gate of the PMOST device 228 is charged up to approximately the level of VBACKUP–$V_{THP}$, which causes the PMOST device 228 to turn off, and the PMOST devices 220, 224, 226 are turned off.

The voltage divider 212 performs functions similar to or the same as the voltage divider 112 of FIG. 1. The voltage divider 212 is a metal-oxide-semiconductor transistor (MOST) only voltage divider that is connected between the primary power supply 102 and the ground. Specifically, the voltage divider 212 includes MOST devices 232, 234. The output voltage of the voltage divider 212 is a function of the output voltage of the primary power supply and of physical parameters of the MOST devices 232, 234 such as the sizes/dimension and process parameters of the MOST devices 232, 234. Consequently the output voltage of the voltage divider 212 is directly proportional to the output voltage of the primary power supply in the saturation region of the operating regions of the transistors 232, 234. For a given supply voltage, the output voltage of the voltage divider 212 can be adjusted to any desired level by adjusting the physical parameters (e.g., effective widths $W_{eff}$/effective lengths $L_{eff}$) of the MOST devices 232, 234. The output voltage ($V_{REF}$) of the voltage divider 212, the output voltage of the primary power supply, and the physical and process parameters of the PMOST and NMOST devices satisfy the following simplified equation in the saturation region of both transistors 232, 234, where ($|V_{DS}|=>(|V_{GS}|-|V_{TH}|$):

$$V_{REF}=[V_{DD}/[1+\text{sqrt}(\beta_N/\beta_P)]]+[-V_{THP}+V_{THN}\times\text{sqrt}(\beta_N/\beta_P)]/[1+\text{sqrt}(\beta_N/\beta_P)] \quad (1)$$

$V_{TH}$ is the threshold voltage of the MOST device 232 or 234, $V_{DS}$ is the drain to source voltage of the MOST device 232 or 234, and $V_{GS}$ is the gate to source voltage of the MOST device 232 or 234. In equation (1), β, which is the transconductance parameter, is equal to $\mu_o C_{OX} \times W_{eff}/L_{eff}$, where $\mu_o$ is the surface mobility of the channel for the n-channel or p-channel device, $C_{OX}$ is the capacitance per unit area of the gate oxide, $W_{eff}$ is the effective channel width of the MOST device 232 or 234, and $L_{eff}$ is the effective channel length of the MOST device 232 or 234. $C_{OX}$ is equal to $\in_{ox}/t_{ox}$, where $\in_{ox}$ is the dielectric constant of the gate oxide and $t_{ox}$ is the thickness of the gate oxide. In equation (1), $V_{REF}$ represents the output voltage of the voltage divider 212, $V_{DD}$ represents the output voltage of the primary power supply, $W_{eff}/L_{eff}$ represents the ratio of the effective conduction channel dimensions of the MOST devices 232, 234, $V_{THP}$ represents the PMOST threshold voltage, and $V_{THN}$ represents the NMOST threshold voltage.

Equation (1) shows that as the ratio $\beta_N/\beta_P$ increases, the output voltage ($V_{REF}$) decreases for a given supply voltage, $V_{DD}$. The structure of the voltage divider 212 is area efficient, and can achieve low current consumption by proper sizing of the channel dimensions ($W_{eff}/L_{eff}$).

The voltage sensor circuit 214 performs functions similar to or the same as the voltage sensor circuit 114 of FIG. 1. In the embodiment depicted in FIG. 2, power is supplied to the voltage sensor circuit 214 by the highest output voltage VMAX between the primary power supply 102 and the battery backup supply 104. When the output voltage of the primary power supply is higher than the output voltage of the battery backup supply, the output voltage of the primary power supply is applied to the voltage sensor circuit 214. Only when the output voltage of the primary power supply is lower than the output voltage of the battery backup supply, the output voltage of the battery backup supply is applied to the voltage sensor circuit 214. The voltage sensor circuit 214 includes two CMOS push-pull inverters 236, 238, which are connected between the power supply 102 or 104 that has the highest voltage (VMAX) and the ground. The CMOS push-pull inverters 236, 238 conduct current only during their input switching in the region between power and ground. Since the power supply switchover level for the power transfer switch 218 occurs in the region where the output voltage of the primary power supply is below the output voltage of the battery backup supply, the battery backup supply in this region is serving both as the power supply and as the known fixed voltage reference for the voltage sensor circuit 214. A single battery backup supply needs to be strong enough so that its output voltage is not pulled down by the load circuit 108, otherwise a second independent battery backup supply may be needed. The CMOS push-pull inverter 236 includes MOST devices 240, 242. The CMOS push-pull inverter 238 includes MOST devices 244, 246 and is configured to insure that the output of the voltage sensor 214 is always at a normal logic level. The input trip point ($V_{TRIP}$), which is also referred to as the power supply switchover point, of the CMOS inverters 236, 238 is defined as the input voltage at which the NMOST and PMOST devices 240, 242, 244, or 246 are both in their saturation region of operation, i.e., $|V_{DS}|=>(|V_{GS}|-|V_{TH}|)$, in which the input voltage is equal to the output voltage. CMOS inverters have very high output gain near their switching-point ($V_{TRIP}$) such that their output swings nearly rail-to-rail with a small change to their input. Similar to the voltage divider 212 described above, the input trip-point of the inverter 236 or 238 for a given supply voltage ($V_{DD}$), can be adjusted to any desired voltage-level in the mid-range by adjusting the physical parameters such as $\beta_N/\beta_P$ of the MOST devices. In an embodiment, the desired primary supply switchover threshold voltage level is set for the CMOS power switching circuit 206 by matching the scaled primary supply output voltage ($V_{REF}$) to the input trip-point ($V_{TRIP}$) of the voltage sensor circuit 214 for a given power supply voltage, VMAX, which is the backup supply when the primary power supply sinks below the backup power supply output. The input trip point voltage ($V_{TRIP}$) can be given by the MOS model equation (1) described above with $V_{REF}$ replaced by $V_{TRIP}$ and $V_{DD}$ replaced by VMAX. In an embodiment, the CMOS inverters 236, 238 output a digital signal that triggers the switch of the power supply of the load circuit from the primary power supply to the backup power supply if the scaled down output voltage of the primary power supply ($V_{REF}$) is detected as being below the input trip point voltage ($V_{TRIP}$). In an embodiment, after the power supply of the load circuit is switched to the backup power supply, the CMOS inverters 236, 238 output a digital signal that triggers the switch of the power supply of the load circuit back to the primary power supply if the scaled down output voltage of the primary power supply ($V_{REF}$) is detected as being above the input trip point voltage ($V_{TRIP}$).

When the output voltage of the primary power supply 102 is below the output voltage of the battery backup supply 104, the voltage VMAX will be the output voltage of the battery backup supply, which may be a fixed reference such as 3V. The input trip points of the push-pull inverters 236, 238 are set by a the ratios of the sizes ($W_{eff}/L_{eff}$) of the NMOST and PMOST devices 240, 242, 244, 246 of each push-pull inverter. The input trip points are set so that the output of the two inverters will switch digital states at a selected output level of the voltage divider 212. In other words, the inverter pair will switch digital output states based on the voltage output level of the primary power supply. Typically, a +/−10% change in the battery voltage output does not significantly change the inverter trip points.

The open transition switch control circuit 216, which is also referred to as the break-before-make circuit, performs functions similar to or the same as the open transition switch control circuit 116 of FIG. 1. In the embodiment depicted in FIG. 2, power is supplied to the open transition switch control circuit 216 by the highest output voltage VMAX between the primary power supply 102 and the battery backup supply 104. When the output voltage of the primary power supply is higher than the output voltage of the battery backup supply, the output voltage of the primary power supply is applied to the open transition switch control circuit 216. Only when the output voltage of the primary power supply is lower than the output voltage of the battery backup supply, the output voltage of the battery backup supply is applied to the open transition switch control circuit 216. The open transition switch control circuit 216 controls the power transfer switch 218 and typically includes low power CMOS logic gates, e.g., inverter and 2-input NAND gates, connected between the voltage VMAX and ground. In the embodiment depicted in FIG. 2, the open transition switch control circuit 216 includes two cross-coupled NAND gates 248, 250 and inverter gates 252, 254, 256, 258, 260 to generate conducting control signals for the power transfer switch 218. Each gate 248-260 is connected between the voltage VMAX and ground, and the two complementary output signals of the open transition switch control circuit 216 swing between the voltage VMAX and ground. In an example of an initial steady-state operation, the input signal to the open transition switch circuit 216 is logical low and the output of the inverter 260 is at logical high and is fed back to the NAND gate 248. The output of the inverter 256 is at logical low and is fed back to the NAND gate 250. The two inputs of NAND gate 250 are at logical low and the two inputs of NAND gate 248 are at logical high. In an example of a switching of states operation, starting from the previously described initial steady-state operation, the input signal to the open transition switch control circuit 216 switches from logical low to logical high. One input to the NAND gate 248 switches to logical low and the output of the NAND gate 248 switches to logical high. The switching of these logical states immediately ripples through the inverter gates 254, 256 so that the output of inverter 256 switches from logical low to logical high. At this moment, the outputs of both inverters 256 and 260 are logical high. The output of the inverter 256 is fed-back to the input of the NAND gate 250 and now the two inputs of the NAND gate 250 are logical high, which switches the output of the NAND gate 250 to logical low. The switching of the output of the NAND gate 250 ripples out to the output of the inverter gate 260, which settles to logical low. In the final steady state of the open transition switch control circuit 216, two inputs of the NAND gate 248 are logical low, the two inputs of the NAND gate 250 are logical high, the output of the inverter 256 is logical high, and the output of the inverter 260 is logical low. The design of the open transition switch control circuit 216 guarantees that both output signals of the open transition switch control circuit 216 are logical high before one of them goes to logical low and selects one of the power supplies 102, 104 to connect to the load circuit 108.

The power transfer switch 218 performs functions similar to or the same as the power transfer switch 118 of FIG. 1. In the embodiment depicted in FIG. 2, power is supplied to the power transfer switch 218 by the highest output voltage VMAX between the primary power supply 102 and the battery backup supply 104. When the output voltage of the primary power supply is higher than the output voltage of the battery backup supply, the output voltage of the primary power supply is applied to the VMAX pin 268 of the power transfer switch 218. Only when the output voltage of the primary power supply is lower than the output voltage of the battery backup supply, the output voltage of the battery backup supply is applied to the VMAX pin 268 of the power transfer switch 218. The power transfer switch 218 includes two PMOST devices 262, 264 with their float N-well substrates connected to the output voltage VMAX, their drain terminals connect to the load circuit and to a capacitor 266 that is connected to the ground, their source terminals connected to either the primary power supply or the battery backup supply, and their gates connected to the switch control signals from the open transition switch control circuit 216 in which the logic circuits 248-260 swing between the voltage VMAX and ground. When the gate voltage of either the PMOST device 262 or the PMOST device 264 is low, the primary voltage supply or the battery backup supply, respectively, is connected to the load circuit 108. Conversely, when the gate voltage of either the PMOST device 262 or the PMOST device 264 is high, the primary power supply or the battery backup supply, respectively, is disconnected from the load circuit. The capacitor 266 is configured to store charge and to maintain the proper voltage on the load circuit during the switch-over time when both PMOST devices 236, 264 are turned off. In addition, the capacitor is also configured to help filter out power glitches during the power supply switch-over. If the load circuit pulls down the voltage level of a single voltage backup supply because of too much current drain, a second independent backup power supply may be necessary for the power transfer switch 218.

In an exemplary operation, upon arrival of a state change signal, the open transition switch control circuit 216 will switch off the PMOST device 262 or 264 of the power transfer switch 218 that is currently conducting, and after a time delay, will switch on the other PMOST device, to prevent a direct short between the two power supplies 102, 104. The open transition switch control circuit 216 also outputs a status signal that indicates which power supply is gated on to (e.g., connected to) the load circuit 108. The status signal can be used by other circuits for control purposes or to record the occurrence of a power failure.

Figure 3:
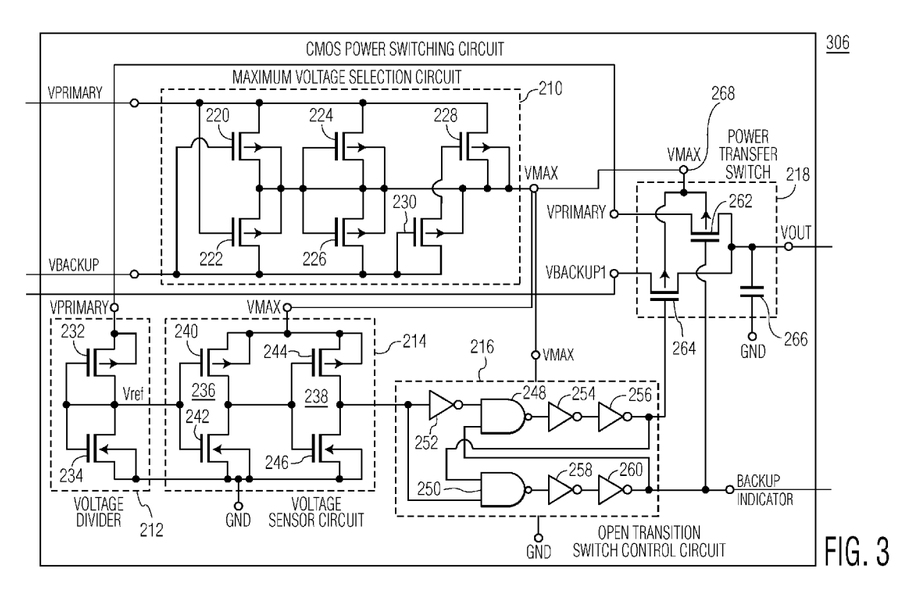
FIG. 3 depicts another embodiment of the CMOS power switching circuit depicted in FIG. 1.

FIG. 3 depicts another embodiment of the CMOS power switching circuit 106 depicted in FIG. 1. The CMOS power switching circuit 306 depicted in FIG. 3 includes same structural components of the CMOS power switching circuit 206 depicted in FIG. 2. The difference between the CMOS power switching circuit 306 depicted in FIG. 3 and the CMOS power switching circuit 206 depicted in FIG. 2 is that two independent backup power supplies are connected to the maximum-voltage select circuit 210, and to the power transfer switch 218. Specifically, a first backup power supply, whose voltage is marked as "VBACKUP," is connected to the maximum voltage selection circuit 210 while a second backup power supply, whose voltage is marked as "VBACKUP1," is connected to the power transfer switch 218. That is, the backup power supply 104 includes the first backup power supply whose voltage is marked as "VBACKUP" and the second backup power supply whose voltage is marked as "VBACKUP1." The two backup power supplies operate independently from each other and provide stronger power than a single power supply. In the embodiment depicted in FIG. 3, the maximum-voltage selection circuit is configured to output the highest output voltage between the output voltage of the primary power supply and an output voltage of the first backup power supply, the open transition switch control circuit 216 is configured to control the switching of the power transfer switch 218 between the primary power supply and the second backup power supply, and the power transfer switch 218 is configured to connect the load circuit 108 to either the primary power supply 102 or the second backup power supply.

Figure 4:
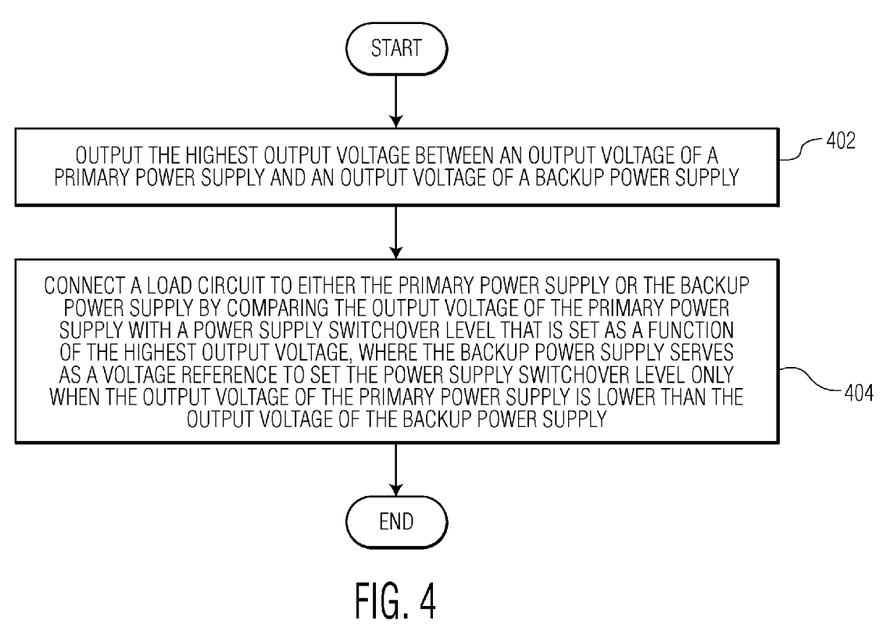
FIG. 4 is a process flow diagram of a method for operating a CMOS power switching circuit in accordance with an embodiment of the invention.

FIG. 4 is a process flow diagram of a method for operating a CMOS power switching circuit in accordance with an embodiment of the invention. The CMOS power switching circuit may be similar to or the same as the CMOS power switching circuit 106, 206, or 306. At block 402, the highest output voltage between an output voltage of a primary power supply and an output voltage of a backup power supply is outputted. At block 404, a load circuit is connected to either the primary power supply or the backup power supply by comparing the output voltage of the primary power supply with a power supply switchover level that is set as a function of the highest output voltage, where the backup power supply serves as a voltage reference to set the power supply switchover level only when the output voltage of the primary power supply is lower than the output voltage of the backup power supply.

Although the operations of the method herein are shown and described in a particular order, the order of the operations of the method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

In addition, although specific embodiments of the invention that have been described or depicted include several components described or depicted herein, other embodiments of the invention may include fewer or more components to implement less or more feature.

Furthermore, although specific embodiments of the invention have been described and depicted, the invention is not to be limited to the specific forms or arrangements of parts so described and depicted. The scope of the invention is to be defined by the claims appended hereto and their equivalents.

What is claimed is:

1. A Complementary Metal Oxide Semiconductor (CMOS) power switching circuit comprising:
   a voltage selection circuit configured to output the highest output voltage between an output voltage of a primary power supply and an output voltage of a backup power supply; and
   a control circuit configured to connect a load circuit to either the primary power supply or the backup power supply by comparing the output voltage of the primary power supply with a power supply switchover level that is different from the output voltage of the backup power supply and is set as a function of the highest output voltage, wherein the backup power supply serves as a voltage reference to set the power supply switchover level only when the output voltage of the primary power supply is lower than the output voltage of the backup power supply, wherein the control circuit comprises:
- a voltage divider configured to scale the output voltage of the primary power supply to generate a scaled output voltage;
- a voltage sensor circuit configured to set a threshold voltage below the output voltage of the backup power supply as a function of the highest output voltage, to compare the scaled output voltage with the threshold voltage, and to output a digital signal indicative of the magnitude of the scaled output voltage relative to the threshold voltage, wherein the voltage sensor circuit is further configured to set the threshold voltage as the function of the output voltage of the backup power supply only when the output voltage of the primary power supply is lower than the output voltage of the backup power supply;
- a power transfer switch configured to connect the load circuit to either the primary power supply or the backup power supply; and
- a switch control circuit configured to control the switching of the power transfer switch between the primary power supply and the backup power supply based on the digital signal.

2. The CMOS power switching circuit of claim 1, wherein the backup power supply includes a first backup power supply and a second backup power supply that is independent from the first backup power supply, wherein the voltage selection circuit is further configured to output the highest output voltage between the output voltage of the primary power supply and an output voltage of the first backup power supply, wherein the power transfer switch is further configured to connect the load circuit to either the primary power supply or the second backup power supply, and wherein the switch control circuit is further configured to control the switching of the power transfer switch between the primary power supply and the second backup power supply based on the digital signal.

3. The CMOS power switching circuit of claim 1, wherein the power transfer switch and the switch control circuit are connected to the power supply that has the highest output voltage, and wherein power is supplied to the voltage sensor circuit, the power transfer switch, and the switch control circuit by the power supply that has the highest output voltage.

4. The CMOS power switching circuit of claim 1, wherein the power transfer switch and the switch control circuit are connected to the power supply that has the highest output voltage, and wherein the power switching circuit is configured such that power is not discharged from the backup power supply by the power switching circuit until the output voltage of the primary power supply output sinks below the output voltage of the backup power supply.

5. The CMOS power switching circuit of claim 1, wherein the voltage selection circuit comprises six P-type MOS transistor (PMOST) devices with floating N-wells substrates connected to an output terminal from which the highest output voltage between the output voltage of the primary power supply and the output voltage of the backup power supply is outputted.

6. The CMOS power switching circuit of claim 5, wherein drain terminals of five of the six PMOST devices are connected to the output terminal of the voltage selection circuit, and wherein source terminals of the six PMOST devices are connected to either the primary power supply or the backup power supply.

7. The CMOS power switching circuit of claim 5, wherein the six PMOST devices include two cross-coupled PMOST devices and three diode-connected PMOST devices, and wherein gate terminals of the three diode-connected PMOST devices is connected to drain terminals of the three diode-connected PMOST devices.

8. The CMOS power switching circuit of claim 1, wherein the voltage divider comprises two metal-oxide-semiconductor transistor (MOST) devices and is connected between the primary power supply and the ground.

9. The CMOS power switching circuit of claim 8, wherein the scaled output voltage is a function of the output voltage of the primary power supply and physical parameters and process parameters of the MOSFET devices.

10. The CMOS power switching circuit of claim 1, wherein the voltage sensor circuit includes two CMOS push-pull inverters connected to the power supply that has the highest voltage and the ground.

11. The CMOS power switching circuit of claim 1, wherein the switch control circuit includes two cross-coupled NAND gates and inverter gates connected to the power supply that has the highest voltage and the ground.

12. The CMOS power switching circuit of claim 1, wherein the power transfer switch includes two P-type MOS transistor (PMOST) devices and a capacitor, wherein gate terminals of the PMOST devices are connected to the switch control circuit and to the power supply that has the highest voltage, and wherein the capacitor is connected to the ground.

13. The CMOS power switching circuit of claim 1, wherein the power supply switchover level is lower than the output voltage of the backup power supply.

14. A Complementary Metal Oxide Semiconductor (CMOS) power switching circuit comprising:
- a voltage selection circuit configured to output the highest output voltage between an output voltage of a primary power supply and an output voltage of a battery backup power supply;
- a voltage divider configured to scale the output voltage of the primary power supply to generate a scaled output voltage;
- a voltage sensor circuit configured to set a threshold voltage as being different from the output voltage of the backup power supply and as a function of the highest output voltage, to compare the scaled output voltage with the threshold voltage, and to output a digital signal indicative of the magnitude of the scaled output voltage relative to the threshold voltage, wherein the voltage sensor circuit is further configured to set the threshold voltage as the function of the output voltage of the backup power supply only when the output voltage of the primary power supply is lower than the output voltage of the backup power supply;
- a power transfer switch configured to connect a load circuit to either the primary power supply or the battery backup power supply; and
- a switch control circuit configured to control the switching of the power transfer switch between the primary power supply and the battery backup power supply based on the digital signal, wherein the voltage divider comprises two metal-oxide-semiconductor transistor (MOST) devices and is connected between the primary power supply and the ground, and wherein the scaled output voltage is a function of the output voltage of the primary power supply and physical parameters and process parameters of the MOSFET devices.

15. The CMOS power switching circuit of claim 14, wherein the backup power supply includes a first backup power supply and a second backup power supply that is independent from the first backup power supply, wherein the voltage selection circuit is further configured to output the highest output voltage between the output voltage of the primary power supply and an output voltage of the first backup power supply, wherein the power transfer switch is further configured to connect the load circuit to either the primary power supply or the second backup power supply, and wherein the switch control circuit is further configured to control the switching of the power transfer switch between the primary power supply and the second backup power supply based on the digital signal.

16. The CMOS power switching circuit of claim 14, wherein the power switching circuit is configured such that power is not discharged from the battery backup power supply by the power switching circuit until the output voltage of the primary power supply output sinks below the output voltage of the battery backup power supply, wherein the voltage selection circuit comprises six P-type MOS transistor (PMOST) devices with floating N-wells substrates connected to an output terminal from which the highest output voltage between the output voltage of the primary power supply and the output voltage of the battery backup power supply is outputted, wherein drain terminals of five of the six PMOST devices are connected to the output terminal of the voltage selection circuit, and wherein source terminals of the six PMOST devices are connected to either the primary power supply or the battery backup power supply.

17. The CMOS power switching circuit of claim 14, wherein the voltage sensor circuit is further configured to set the threshold voltage below the output voltage of the battery backup power supply as the function of the highest output voltage the power transfer switch, wherein the power transfer switch and the switch control circuit are connected to the power supply that has the highest output voltage, and wherein power is supplied to the voltage sensor circuit, the power transfer switch, and the switch control circuit by the power supply that has the highest output voltage.

18. A method for operating a Complementary Metal Oxide Semiconductor (CMOS) power switching circuit, the method comprising:
    outputting the highest output voltage between an output voltage of a primary power supply and an output voltage of a backup power supply; and
    connecting a load circuit to either the primary power supply or the backup power supply by comparing the output voltage of the primary power supply with a power supply switchover level that is different from the output voltage of the backup power supply and is set as a function of the highest output voltage, wherein the backup power supply serves as a voltage reference to set the power supply switchover level only when the output voltage of the primary power supply is lower than the output voltage of the backup power supply, wherein connecting the load circuit to either the primary power supply or the backup power supply comprise:
    scaling the output voltage of the primary power supply to generate a scaled output voltage;
    setting a threshold voltage below the output voltage of the backup power supply as a function of the highest output voltage, comparing the scaled output voltage with the threshold voltage, and outputting a digital signal indicative of the magnitude of the scaled output voltage relative to the threshold voltage, wherein setting the threshold voltage comprises setting the threshold voltage as the function of the output voltage of the backup power supply only when the output voltage of the primary power supply is lower than the output voltage of the backup power supply; and
    controlling the switching of the power transfer switch between the primary power supply and the backup power supply based on the digital signal.

19. The CMOS power switching circuit of claim 1, wherein the voltage selection circuit comprises six P-type MOS transistor (PMOST) devices with floating N-wells substrates connected to an output terminal from which the highest output voltage between the output voltage of the primary power supply and the output voltage of the backup power supply is outputted, wherein drain terminals of five of the six PMOST devices are connected to the output terminal of the voltage selection circuit, wherein source terminals of the six PMOST devices are connected to either the primary power supply or the backup power supply, wherein the voltage sensor circuit includes two CMOS push-pull inverters connected to the power supply that has the highest voltage and the ground, wherein the switch control circuit includes two cross-coupled NAND gates and inverter gates connected to the power supply that has the highest voltage and the ground, wherein the power transfer switch includes two other PMOST devices and a capacitor, wherein gate terminals of the two other PMOST devices are connected to the switch control circuit and to the power supply that has the highest voltage, and wherein the capacitor is connected to the ground.

* * * * *